United States Patent [19]
Hughes, Jr.

[11] Patent Number: 5,077,801
[45] Date of Patent: Dec. 31, 1991

[54] FOREGROUND MUSIC SYSTEM USING CURRENT AMPLIFICATION

[76] Inventor: Robert K. Hughes, Jr., 8739-17th NW., Seattle, Wash. 98117

[21] Appl. No.: 557,518

[22] Filed: Jul. 24, 1990

Related U.S. Application Data

[63] Continuation of Ser. No. 74,274, Jul. 16, 1987, abandoned, which is a continuation of Ser. No. 726,051, Apr. 23, 1985, abandoned.

[51] Int. Cl.[5] .............................................. H03G 3/30
[52] U.S. Cl. .................................... 381/120; 330/148; 381/82
[58] Field of Search .................... 330/148; 381/77, 78, 381/82, 85, 55, 120

[56] References Cited

U.S. PATENT DOCUMENTS 4,048,573 9/1977 Evans et al. ........................ 330/139
4,581,589 4/1986 Ikoma ................................ 330/280

*Primary Examiner*—Forester W. Isen
*Attorney, Agent, or Firm*—Jensen & Puntigam

[57] ABSTRACT

A foreground music sound system includes at least one complementary array of speakers (12) comprising a bass frequency speaker (20) and a plurality of microspeackers (14–18). The complementary speaker array may be designed to provide full frequency response with substantially uniform sound coverage for a wide variety of acoustic environments. A current amplifier (25) is responsive to a music signal input and a microphone signal input to directly drive the speakers. The amplifier (25) is a high current, low impedance amplifier so that it is capable of driving a large number of speakers, without the need for matching transformers at each speaker.

4 Claims, 2 Drawing Sheets

FOREGROUND MUSIC SYSTEM USING CURRENT AMPLIFICATION

This is a continuation of application Ser. No. 074,274 filed on July 16, 1987, which was a continuation of application Ser. No. 726,051, filed on Apr. 23, 1985, now abandoned.

TECHNICAL FIELD

This invention relates generally to the art of music sound systems, and more particularly concerns a music sound system which includes multiple speakers for coverage of large acoustic environments such as restaurants, retail stores, and the like.

BACKGROUND ART

Music sound systems for background coverage are well known, and have been used in public places such as restaurants and retail stores, as well as other locations, for a number of years. Such background music sound systems use compilations of re-recorded musical compositions, as opposed to original recordings, and provide low level background music which is low fidelity and somewhat innocuous. Such systems typically include a plurality of ceiling speakers with a "constant voltage" (usually 70 volts or 25 volts) distribution system, with transformers at each speaker for impedance matching. Signal sources for such background systems include radio subcarrier and telephone lines, both with limited bandwidth.

In such background systems, the low fidelity of the sound system was tolerable because of the limited purpose of the background music. However, the desire for better sound, which is particularly important when the program includes original musical recordings, with high quality instrumentals and vocals, began to change the composition of such systems. Thus, higher quality speakers were introduced and higher quality/high cost transformers were used to overcome some of the bandwidth limitations of the background type system transformers previously used. Additional speakers were added to the system to provide better coverage. However, such improvements added significantly to the cost of the sound system, and installation costs were significantly increased as well.

In a further development, bookshelf speakers having good frequency response replaced the ceiling speakers. Bookshelf type speakers are more expensive, but reduced the total number of speakers necessary because of their inherent broad horizontal coverage, which creates a pleasant ambient sound coverage with good bass response and adequate sound level. In some systems, bookshelf speakers are used in combination with ceiling speakers.

At the same time, high fidelity cartridge tape player systems were developed for program material extending for four hours or more. Extended play "programs" with a common theme comprising a series of original musical recordings then became available. The cartridge tape systems are desirable because they do not require any operator supervision and accordingly, the number of potential applications of such systems has increased significantly.

Such music sound systems became known as "foreground" music systems, connoting a higher quality sound using original recordings which is used to create an ambience, i.e. an atmosphere, which so-called background music systems could not. Such foreground systems have been installed successfully in many locations, particularly restaurants.

The disadvantages of previous foreground systems include increased cost of the components of the system, particularly the speakers and the transformers, increased cost of installation, and physical installation limitations because of the size and configuration of the bookshelf speakers and their associated transformers. Many potential applications, such as office space, grocery stores, and department stores, have been heretofore essentially excluded from using foreground music systems because of such limitations.

Still further, even such improved systems often lacked a full frequency response and frequently did not achieve uniform sound levels and desired overlap coverage throughout the entire area to be covered, due to the difficulty in achieving proper placement of the bookshelf speakers. Related to this problem is the matter of reverberation, which can be a significant problem in some acoustic environments, causing the music to become unintelligible or even annoying. The high cost of increasing the number of speakers and the lack of proper locations for the speakers even if cost were not an issue frequently prevent adequate solution to these problems.

A related problem with such systems concerns the use of a microphone for paging in the same sound system. The microphone volume is often difficult and/or inconvenient to control, both alone and relative to the music volume, and this often results in a page being difficult to hear, particularly as the ambient noise in the area increases. Distortion of the microphone sound also results with existing systems, because of overload.

The present invention, in attempting to solve the above problems and disadvantages, uses a complimentary array of microspeakers and bookshelf speakers to provide full sound coverage with good frequency response, driven by a current amplification circuit which provides the amplification necessary as well as an impedance match with the speakers, thereby eliminating the speaker transformers.

DISCLOSURE OF THE INVENTION

Accordingly, the present invention is a foreground sound system for coverage of a selected acoustic environment, the system being responsive to electrical signals from a source thereof, such as a tape player, including a plurality of speakers for location at selected points in the acoustic environment, and current amplification means responsive to the electrical signals for amplifying the electrical signals and applying the amplified signals to the speakers for reproduction thereof, the amplification means also providing an impedance match for said speakers, the system being characterized by an absence of transformers for the speakers.

BEST MODE FOR CARRYING OUT THE INVENTION

Figure 1:
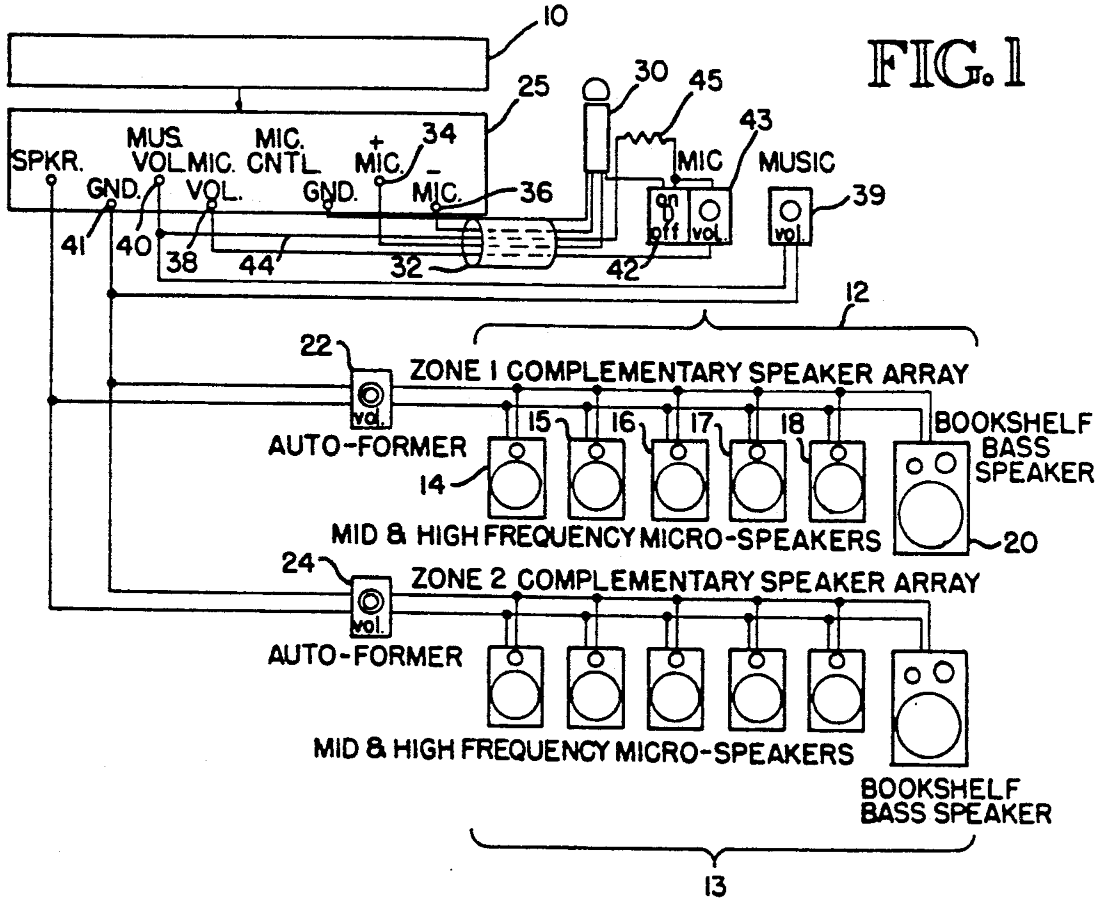
FIG. 1 is a diagram showing the components of a representative system incorporating the principles of the present invention.

FIG. 1 shows in schematic form a music sound system incorporating the principles of the present invention. The source of the music, shown in block form at 10, is a high quality, heavy duty tape player. For systems such as shown herein, a tape player is particularly designed and constructed to withstand unusually heavy and continuous use. The tape player per se, however, does not form a part of the present invention, as music signals from a variety of sources could be used with the sound system of the present invention. A tape player, however, is preferred for such systems.

The music programs are, for the system shown, as well as other foreground music systems, recorded on a tape cartridge capable of extended play, i.e. from four to twelve hours of continuous music. The programs are compilations of original musical recordings. Appropriate permission is obtained in order to compile such recordings. Each extended play program will typically reflect a certain music theme or style, and are selected from many available by the proprietor of the acoustic environment, to establish a desired musical ambience. Different programs are selected for different acoustic environments, such as restaurants, department stores, grocery stores and other retail establishments, as well as many work places, such as office buildings.

The system of the present invention typically, but not necessarily, uses a complementary array of speakers to provide a high quality sound system, with full frequency response, relatively high average sound level capability and substantially uniform coverage over the entire acoustic environment. A relatively large number of speakers is used to provide the uniform sound coverage, create a proper ambient sound field over the entire environment, and reduce the negative effect of reverberation, which at the extreme tends to render the sound unintelligible.

For purposes of illustration, FIG. 1 shows in diagrammatic form two complementary speaker arrays 12 and 13, with each array, e.g. array 12, including five mid and high frequency microspeakers 14–18, and one full range bookshelf speaker 20 to cover the bass frequencies. The microspeakers and the bass speaker thus "complement" each other to produce the desired full frequency response. In the embodiment shown, the speakers are 8 ohm and are used in parallel. Conventional low-impedance auto former attenuators 22, 24 can be used to control the volume in each array, or branch, 12 and 13, in similar fashion to known systems.

Microspeakers, such as the Audio Source LS-1 and the B. P. Electronics HF-9, are well known in the art, and provide broad dispersion, general sound coverage for the directional portion of the sound spectrum, i.e. in the mid frequency and high frequency range. Microspeakers are small, relatively low cost and are easy to locate and mount, and therefore can be used in sufficient numbers to provide the necessary high quality sound density and pattern control for the directional portion of the spectrum to accomplish substantial uniformity of sound dispersion throughout the acoustic environment. They may be mounted around the room at various heights and also on or in the ceiling to provide the necessary coverage.

However, microspeakers alone are insufficient for a high quality sound system, because they do not have good low-frequency (bass) response. At least one full range bookshelf type (bass) speaker 20 is a part of each array to provide the required bass coverage as well as additional high frequency coverage. The bass speaker, such as the Matrecs #308 and comparable speakers, is used to "fill-in" the frequency coverage, producing the non-directional portion of the low frequency spectrum for the selected acoustic environment. The bass speakers thus act essentially like sub-woofers in a two-way system. The few bass speakers in the system may be mounted in one or two discrete locations, thereby avoiding or at least minimizing the aesthetics problem. The above described complementary speaker system provides the full frequency coverage desired with substantially uniform sound dispersion and at desired sound levels.

Although the system shown in FIG. 1 shows two complementary speaker arrays, each comprising five microspeakers and one bookshelf speaker, it should be understood that various complementary arrangements of microspeakers and bookshelf (bass) speakers can be used, depending upon the particular acoustic environment being covered. A well designed complementary system not only provides a full frequency response with good volume levels, but also substantially uniform sound coverage throughout the entire acoustic environment. Because of the design flexibility made possible by complementary speaker arrays, virtually any acoustic environment now presents a possible opportunity for use of foreground music. Previously, the opportunities were rather limited, because of the heavy dependence on bookshelf type speakers.

However, even a complementary speaker system requires transformers at each speaker, including each microspeaker, under the traditional design approach. Transformers do limit the use of such a system as a practical consideration, because the transformers are expensive and also are difficult to mount relative to each speaker. The transformers are fairly large in size, almost one quarter the size of the microspeakers themselves.

Transformers also present a potential problem relative to low frequency boost which is used in a complementary system primarily to boost the output of the low frequency speakers sufficiently to balance the sound level of the microspeakers and produce the low-frequency contour for the desired subwoofer effect. The low-frequency roll-off of the microspeakers is also aided by the use of low frequency boost, starting at about 200 Hz. Such a low-frequency boost, however, while very desirable for equalization purposes, would be ineffective and potentially dangerous in a transformer coupled system because core saturation of the transformers limits low frequency amplitude and results in the equivalent of a short circuit load to the amplifier.

Figure 3:
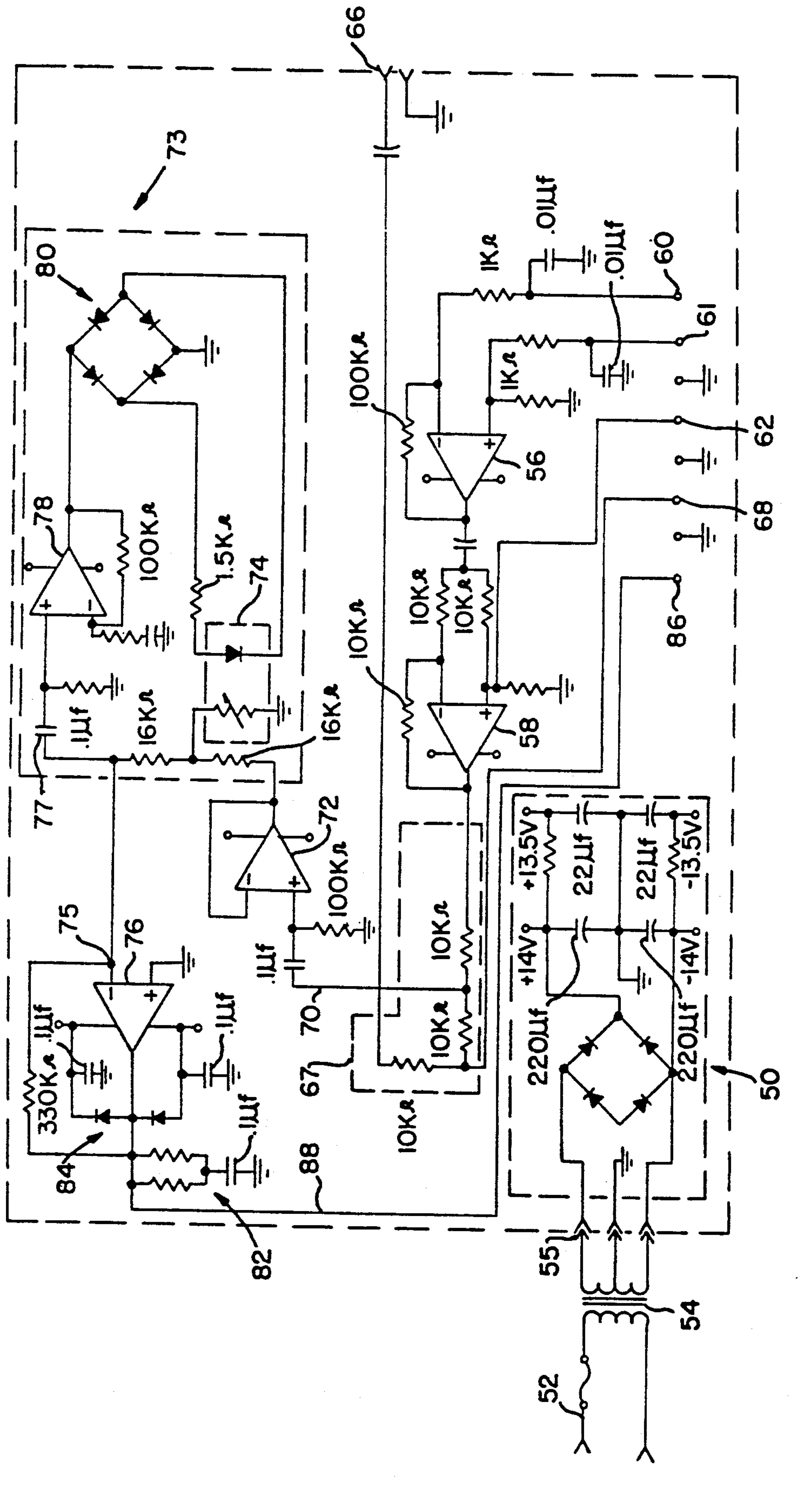
FIG. 3 is a schematic diagram showing the current amplification circuit of the present invention.

In the present invention, the transformers are completely eliminated, functionally replaced by a current amplifier shown at 25 in FIG. 1 and in schematic form in FIG. 3. The current amplifier 25 has a low voltage, high current output capable of driving a large number of low-impedance speakers connected in parallel. The actual number of speakers depends upon the desired loudness of the system, and is determined by the amplifier's current capacity and the efficiency of the speakers. In the embodiment shown, a single amplifier is easily capable of driving the system shown in FIG. 1, i.e. 10 microspeakers and two bookshelf speakers, connected in parallel, with the speakers having an 8 ohm impedance.

Although a low voltage, high current system using parallel wiring raises the possibility of line (wire) loss, in fact a system would require over 200 feet of 18 gauge wire to produce an audible difference.

Further, appropriate wiring patterns could reduce any volume balance problems between speakers. Further, although the description herein assumes parallel wiring and 8 ohm speakers, such parameters are not absolutely necessary for the system of the present invention.

The current amplifier 25 (FIG. 1) also has a low impedance output so as to provide a proper impedance match between the amplifier and the individual low impedance (typically 8 ohm) speakers in the embodiment shown and described herein. Thus, the use of the current amplifier 25 permits the elimination of the transformers, which significantly reduces the cost of the system, both with respect to elements and installation.

Another feature of the music sound system of the present invention shown in FIG. 1 is volume control of both the music and a microphone 30 at a position which is remote from the tape player 10 and current amplifier 25, which are usually located together. A possible remote location might be at a hostess station, a receptionist's desk, or other paging station. In the embodiment shown, remote microphone 30 is connected via a four conductor (plus ground) shielded wire, shown generally at 32, to the positive and negative microphone connections 34 and 36 and microphone volume connection 38 on amplifier 25. A variable resistance 39 provides remote music volume control, with connections to music volume and speaker ground connections 40 and 41, respectively.

Microphone 30 is controlled by an on-off switch 42, which is connected in series with a variable resistance 43, which has the effect of gating the volume of the microphone on and off. Switch 42 is also in series with a 10K ohm resistor 45, which has the effect of muting the music to a volume determined by the value of resistor 45, when microphone switch 42 is in the on position. The sound level of the microphone is thus substantially independent of the music volume. Since the signal from microphone volume control resistance 43 is applied to microphone volume connection 38, and since muting resistance 45 is connected to resistance 43 and music volume connection 40, through wire lead 44, the volume of the music is slightly increased when the microphone is off, because, in that condition, a portion of the music signal is fed from music volume connection 40 to the microphone volume terminal 38 and therefore amplified. Thus, the microphone volume resistance 43 has a small impact on music volume, but primarily controls microphone volume.

At high volumes, a dynamic volume adjustment takes effect. When the microphone is operated, the music is compressed to a low volume level, so that the maximum permissable sound level of the system is not exceeded, thus preventing distortion. This is achieved by the peak limiting and compression circuitry in amplifier 25 which will be explained in more detail in following paragraphs.

Referring now to FIG. 3, a schematic diagram of the current amplifier circuit of the present invention is shown. The circuit is driven by a conventional high current, low impedance power supply shown generally at 50. The power supply 50 is responsive to a voltage from a line connection 52, through transformer 54 and a molex plug connector 55, and includes a conventional rectifying circuit and a resistive/capacitive network to produce outputs of ±14 volts at ±4.0 amps and ±13.5 volts, at ±0.40 amps.

Operational amplifiers 56 and 58 are dual op-amp ICs and form a pre-amplifier section which amplifies and controls the microphone input signals. The microphone input signals are applied at input connections 60 and 61 while the microphone volume input signal is applied to input connection 62. The microphone input connections 60 and 61 are in turn connected to the noninverting and inverting inputs of amplifier 56, while microphone volume input connection 62 is in turn connected to the noninverting input of amplifier 58.

Amplifier 58 feeds into a resistive attenuator circuit 67, which functions to attenuate the music level. The music signal is fed into the circuit through a molex connector 66 while the music volume control signal is applied to input connection 68. The attenuation circuit 67 permits control of the music volume and muting by a remote, i.e. external resistance to ground, such as resistance 39 in FIG. 1.

The output of attenuator circuit 67, on line 70, is AC coupled to a buffer amplifier 72 which amplifies both the music and the microphone signals, the output of which feeds a signal processor which functions as a protective circuit shown generally at 73. Protective circuit 73 combines peak limiting and signal compression functions to prevent output distortion, both for the music alone and when paging (microphone) is used. The peak to-average power ration for foreground music is between 10:1 and 100:1, and is usually toward the higher end when low-frequency boost is used. Such parameters require that a 100 w amplifier be used to get 1 w of average power without clipping. Clipping of course is undesirable as it produces a very unpleasant audible distortion. The protective circuit/signal processor 73 shown monitors the output signal as reflected at point 75, and is designed with particular attack and release time constants corresponding to the music material so that protective signal compression can be effected regardless of load, without affecting music quality. This protection also is operative when the microphone is operated. When paging is initiated, the level of the combined microphone signal and the music signal is maintained below distortion level.

Signal processing circuit 73 includes an LED/LDR optical isolator 74. As indicated above, the inverting input 75 of output amplifier 76 is monitored by the circuit 73. Typically, input 75 is at zero volts, a virtual ground. If there is any distortion in the output signal as reflected at that point, an error voltage will develop at input 75, which error voltage is amplified and applied through a capacitor 77 to the non-inverting input of high gain amplifier 78, which is part of a dual op-amp IC with amplifier 72. The error signal from amplifier 78 is converted by the bridge 80 into a DC voltage, which in turn drives the LED in the optical isolator 74, resulting in an attenuation in the signal from buffer amplifier 72, thereby restricting the operation of the amplifier to its linear mode.

The LED/LDR isolator 74 is designed to provide the right time constants, so that it can respond with the appropriate attack/release times quickly enough to prevent most distortion for the particular program material being played, but not so quickly as to disturb the sound dynamics of the program.

Output amplifier 78 has built in protection circuits for current limiting, as well as temperature sensing. It also has external protection, including a resistive/capacitive network 79 for signal phase stability for low impedance loads, as well as a diode network 84 for protection against voltage kickbacks from the load.

Amplifier 78 is operated with a large amount of negative feedback, which aids in reducing the effective output impedance of amplifier 78 to a relatively low value, thereby providing the desired matching to the 8 ohm speakers in the system. The output of amplifier 78 is applied to speaker output connection 86 over line 88.

Figure 2:
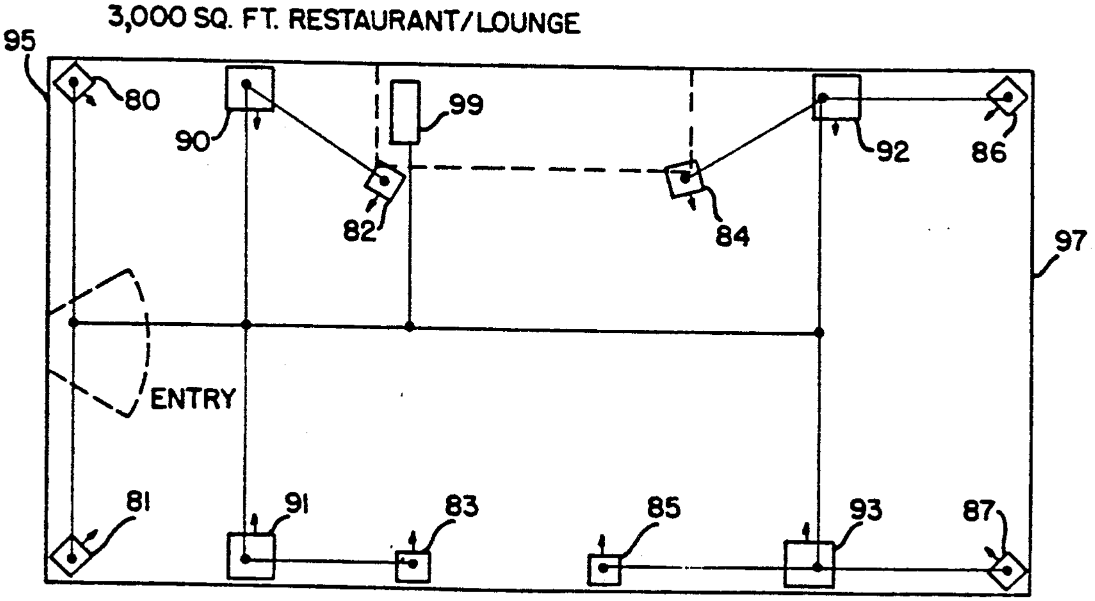
FIG. 2 is a diagram showing a system incorporating the principles of the present invention arranged in a particular acoustic environment.

FIG. 2 shows a typical system installation in an acoustic environment which is substantially rectangular in configuration, approximately 3000 sq. ft., with a 10 ft. high ceiling. Microspeakers 80-87 are mounted on the walls of the space just below the ceiling, aimed at about 20 degrees below the horizontal. Most of the sound from the microspeakers is directed toward the center of the room, which is approximately 20 feet away. Four bookshelf base speakers 90-93 are mounted against the side walls, at points approximately 25% of the total length of the wall in from each end wall 95 and 97. The system is controlled at the tape player/amplifier 99.

The speakers are wired with 18 gauge wire and in the pattern shown to result in a fairly equal power distribution per speaker. A slight emphasis is provided to the speakers near the entry, and a slight de-emphasis to the speakers near the area in the middle of the room. The speakers could also carry individual volume controls for separate trimming, if desired. Although a microphone is not shown in FIG. 2, it could be easily added at a selected location.

Thus, a sound system has been described which produces a high fidelity sound over a selected acoustic area with substantially uniform sound distribution. This desirable result is accomplished through the use of complementary arrays of speakers, in combination with a high current, low impedance output current amplifier which eliminates the need for matching transformers at the speakers. The current amplifier includes means for insuring substantially distortionless output, regardless of load. The system also includes microphone activated music muting and remote volume control of microphone and music.

Although a preferred embodiment of the invention has been disclosed herein for illustration, it should be understood that various changes, modifications and substitutions may be incorporated in such embodiment without departing from the spirit of the invention, as defined by the claims which follow.

I claim:

1. An amplifier responsive to electrical input signals for driving a low impedance load, comprising:

a current-limited signal amplifier having an inverting input for receiving an electrical input signal and having a low voltage, high current output for amplifying the electrical input signals and applying the amplified signals to the low impedance load, said current amplifier including a negative feedback circuit which reduces the output impedance of the signal amplifier to approximately that of the low impedance load, wherein the output voltage from the signal amplifier is sufficiently low and the output current is sufficiently high that adequate power is available to drive the low impedance load without a voltage transformer at the output of the signal amplifier;

means directly coupling the output of the signal amplifier to the low impedance load without any impedance-matching transformers or other impedance-matching means; and amplifier protection means for monitoring just the distortion component, if any, of the output signal from the signal amplifier and for developing an error signal therefrom, including means connecting the output of the signal amplifier to the inverting input of the signal amplifier, the inverting input remaining at substantially zero volts as long as there is no distortion component in the output signal, wherein the error signal is developed from a voltage signal which is developed at the inverting input when the output signal begins to distort, the error signal having an amplitude directly related to the amplitude of said distortion component, the amplifier protection means including a feedback circuit for attenuating the electrical input signals with said error signal so as to restrict the operation of the signal amplifier to its linear mode and maintain the output of the signal amplifier substantially at its maximum average operating level, thereby preventing overdriving and subsequent damage to the signal amplifier.

2. An apparatus of claim 1, wherein the voltage signal developed at the inverting input of the signal amplifier is representative of the distortion component of the output signal and wherein the amplifier protection means includes an error amplifier means for amplifying the voltage signal and converting the voltage signal into a DC error voltage, wherein the signal amplifier includes a preamplifier and wherein the DC error voltage is transmitted to the preamplifier to reduce the input signals to the signal amplifier, so as to maintain the output of the signal amplifier at substantially its maximum operating level, without overdriving the signal amplifier.

3. An amplifier protection circuit which in operation monitors the distortion component, if any, of an output signal from a signal amplifier having an inverting input receiving an electrical input signal, comprising:

means connecting the output of the signal amplifier to the inverting input thereof, such that the voltage at the inverting input of the signal amplifier remains at substantially zero volts as long as there is no distortion component present in the output signal and such that a voltage signal develops at the inverting input of the signal amplifier when the output signal of the signal amplifier begins to distort, the voltage signal having an amplitude directly related to the amplitude of said distortion component; and feedback circuit means using the voltage signal for attenuating the electrical input signal so as to restrict the operation of the signal amplifier to its linear mode and maintain the output of the signal amplifier substantially at its maximum average operating level, thereby preventing overdriving and subsequent damage to the signal amplifier.

4. An apparatus of claim 3, including an error amplifier means for amplifying the voltage signal and converting the voltage signal into a DC error voltage, wherein the signal amplifier includes a preamplifier and wherein the DC error voltage is transmitted to the preamplifier to reduce the input signal current to the signal amplifier, so as to maintain the output of the signal amplifier at substantially its maximum operating level, without overdriving the signal amplifier.

* * * * *